(12) United States Patent
Roeckner et al.

(10) Patent No.: US 6,819,912 B2
(45) Date of Patent: Nov. 16, 2004

(54) VARIABLE FREQUENCY SWITCHING AMPLIFIER AND METHOD THEREFOR

(75) Inventors: William Roeckner, Carpentersville, IL (US); Pallab Midya, Schaumburg, IL (US); Gregory Buchwald, Crystal Lake, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 142 days.

(21) Appl. No.: 10/008,121

(22) Filed: Nov. 5, 2001

(65) Prior Publication Data

US 2003/0087621 A1 May 8, 2003

(51) Int. Cl.[7] ................................................ H03F 3/38
(52) U.S. Cl. ................... 455/296; 455/67.13; 455/310; 330/10; 330/251
(58) Field of Search ............... 455/296, 63.1, 455/67.13, 310, 218–222; 330/251, 10

(56) References Cited

U.S. PATENT DOCUMENTS

| | | | | |
|---|---|---|---|---|
| 4,180,776 A | * | 12/1979 | Lindemann | ................. 325/25 |
| 4,952,884 A | | 8/1990 | Tokumo et al. | |
| 6,127,885 A | * | 10/2000 | Colangelo | ................. 330/10 |
| 6,297,693 B1 | | 10/2001 | Pullen | |
| 6,498,531 B1 | * | 12/2002 | Ulrick et al. | ................. 330/10 |
| 6,545,533 B2 | * | 4/2003 | Karki et al. | ................. 330/10 |
| 6,587,670 B1 | * | 7/2003 | Hoyt et al. | ................. 455/71 |
| 6,593,807 B2 | * | 7/2003 | Groves et al. | ................. 330/10 |
| 2001/0011013 A1 | | 8/2001 | Vorenkamp et al. | |

FOREIGN PATENT DOCUMENTS

| | | |
|---|---|---|
| EP | 1 014 566 | 6/2000 |
| JP | 63219211 | 9/1988 |

OTHER PUBLICATIONS

International Search Report.

* cited by examiner

*Primary Examiner*—Edward F. Urban
*Assistant Examiner*—Blane J. Jackson
(74) *Attorney, Agent, or Firm*—Joanna G. Chiu; James L. Clingan, Jr.

(57) ABSTRACT

A switching amplifier generates noise at its switching frequency and harmonics thereof. The noise at these harmonics, for an audio amplifier, will be generated with significant amplitude in the AM band. Thus, an AM tuner will experience interference problems if the tuner frequency is sufficiently close to one of these harmonics. To avoid this problem the switching frequency of the switching amplifier is chosen based on the tuner frequency. Thus, the switching frequency is chosen to avoid having harmonics at or too near the chosen tuner frequency. The switching amplifier is disabled when the tuner is in seek or scan mode. Instead of using the tuner frequency to determine what switching frequency should be used to avoid interference, the interference can be detected directly to cause a change in the switching frequency and thus remove the interference.

13 Claims, 3 Drawing Sheets

VARIABLE FREQUENCY SWITCHING AMPLIFIER AND METHOD THEREFOR

FIELD OF THE INVENTION

The present invention relates generally to switching amplifiers and more specifically to a variable frequency switching amplifier.

RELATED ART

Switching amplifiers, such as, for example, class D audio amplifiers have associated with them a potentially high level of radiated energy at multiples of the switching frequency. This radiated switching energy can result in electromagnetic interference (EMI) issues in adjacent circuitry. This can be particularly troublesome when trying to package the switching amplifier with a radio tuner, such as in an audio-video (AV) receiver. Currently, careful layout and filter design, coupled with shielding, is used to reduce the radiation. For example, the tuner is placed at a far enough distance from the switching amplifier so as to reduce the effects of radiation. Also, heavy shielding may be used to minimize the radiation. However, these solutions become costly and some switching energy, regardless of placement, shielding, or filtering will still be present. Therefore, a need exists for a low cost method for enabling a switching amplifier to be in proximity to a tuner without corrupting the received signal.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

As discussed above, switching audio amplifiers, such as, for example, class D audio amplifiers, emit potentially high levels of radiated energy at multiples of the switching frequency that can result in EMI issues with adjacent circuitry. For example, this adjacent circuitry may include a radio tuner. Therefore, problems may arise when packaging a radio tuner (such as, for example, an audio-video (AV) receiver) with a switching amplifier. For example, switching amplifiers typically switch in the 350 to 400 kHz range. Therefore, second, third, and fourth harmonics of this frequency fall directly in the AM radio band (e.g. 530 to 1710 kHz). Higher order harmonics can also fall in the FM Intermediate Frequency (IF) band (e.g. 10.7 MHz). (Note that the AM radio band and the FM IF band may be within different frequency ranges than those given above.) Prior solutions have therefore attempted to solve this problem through the use of layout, filter design, and shielding. However, these solutions become costly and increase the resulting product size. Therefore, a need exists for a lower cost solution that allows for cohabitation of a switching amplifier with a tuner that reduces interference caused by the switching energy.

Figure 1:
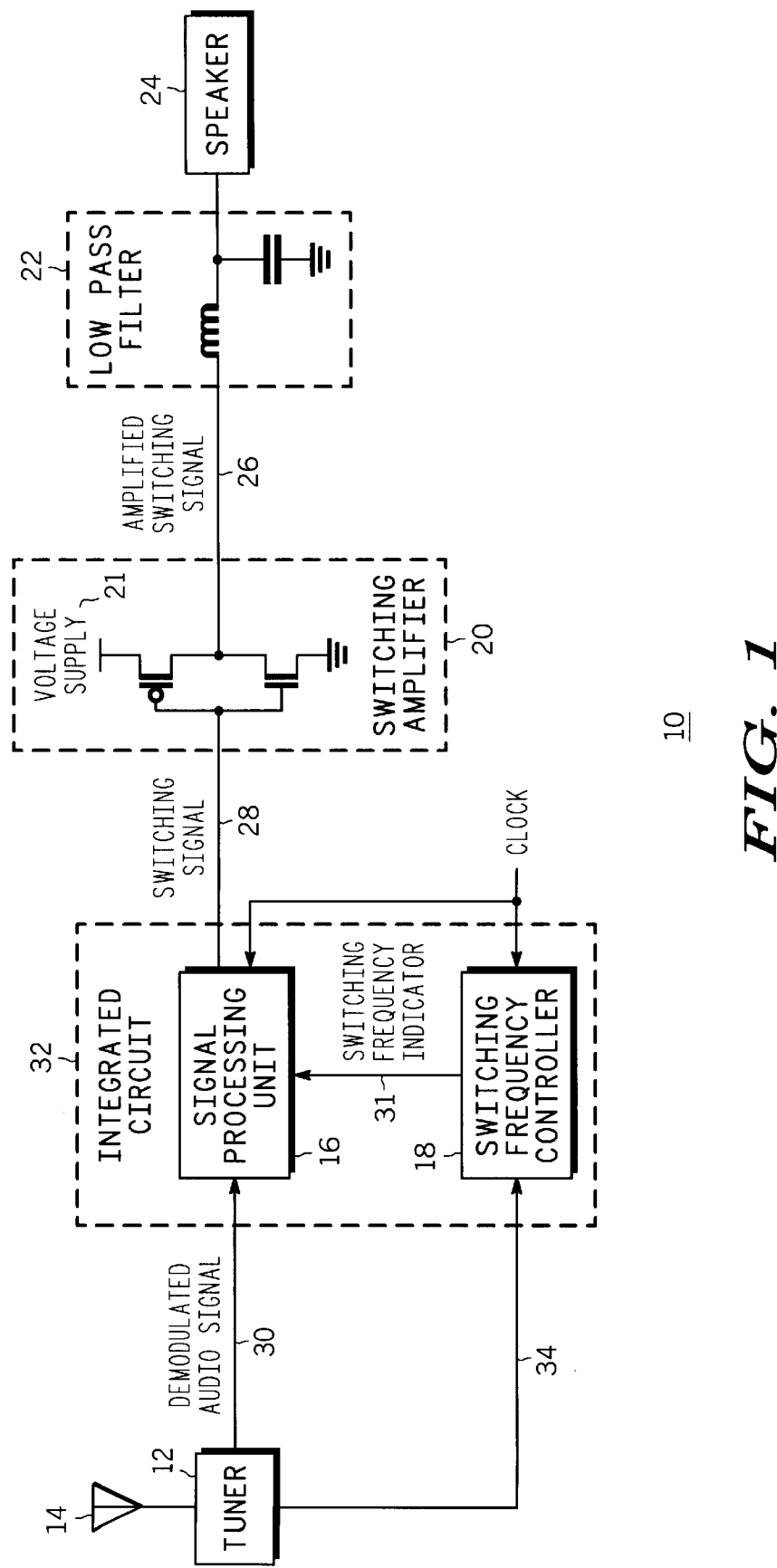
FIG. 1 illustrates, in block diagram form, a switching amplifier system in accordance with one embodiment of the present invention.

FIG. 1 illustrates, in block diagram form, a switching amplifier system 10 in accordance with one embodiment of the present invention. Switching amplifier system 10 includes tuner 12 coupled to antenna 14, signal processing unit 16, and switching frequency controller 18. Switching frequency controller 18 is coupled to signal processing unit 16. Signal processing unit 16 and switching frequency controller 18 are both coupled to receive a CLOCK signal which is provided, in one embodiment, by a crystal oscillator (not shown). Signal processing unit 16 and switching frequency controller 18 are included within integrated circuit (IC) 32. IC 32 may include other components of FIG. 1 or other components not shown in FIG. 1. Signal processing unit 16 is coupled to switching amplifier 20 which is coupled to an optional low pass filter 22 which is coupled to speaker 24. In one embodiment, tuner 12 is an AM-FM tuner used in proximity with switching amplifier 20. (Switching amplifier 20 may be a switching power amplifier, such as, for example, a switching class D audio power amplifier, or any type of switching differential output amplifier. Although FIG. 1 illustrates switching amplifier 20 as an inverter, switching amplifier 20 may be designed in a variety of different ways and include additional circuitry components.) Therefore, in one embodiment, tuner 12 may be a car stereo that is located in the car dashboard in close proximity with the switching amplifier, also located in the dashboard. In alternate embodiments, tuner 12 may be an AM-only tuner. Tuner 12 may receive a digital signal via antenna 14, such as a digital broadcast, or, in another embodiment, tuner 12 may receive an analog radio signal via antenna 14. In yet another embodiment, tuner 12 may receive both digital and analog radio signals via antenna 14, either independently or simultaneously.

In operation, tuner 12 receives a modulated radio signal from antenna 14, and provides a demodulated audio signal 30, corresponding to the received modulated radio signal, to signal processing unit 16. Tuner 12 also provides a control signal 34 to switching frequency controller 18. (Note that in some embodiments control signal 34 may transfer more than one control signal to switching frequency controller 18. In this case, control signal 34 may be a control bus having a plurality of conductors.) Switching frequency controller 18 provides a switching frequency indicator 31 to signal processing unit 16 which corresponds to the switching frequency, $F_s$, of switching amplifier 20. Switching frequency controller 18 is therefore capable of modifying $F_s$ in response to control signal 34, as will be described further below in reference to FIGS. 2–4. For example, control signal 34 may indicate to switching frequency controller 18 the frequency at which frequency tuner 12 is tuned. Signal processing unit 16 receives switching frequency indicator 31 and demodulated audio signal 30 and generates an appropriately modulated signal, switching signal 28, to drive switching amplifier 20. For example, signal processing unit 16 may generate a pulse width modulated (PWM) signal from demodulated audio signal 30 to drive switching amplifier 20. This PWM signal may either be a single-sided PWM signal (meaning only the rising or the falling edge is modulated) or a two-sided PWM signal (meaning that both the rising and the falling edges are modulated). Alternatively, signal processing unit 16 may generate a pulse density modulated (PDM) signal instead of a PWM signal. Therefore, signal processing unit 16 may use various different methods to appropriately modify demodulated audio signal 30 and generate switching signal 28 for driving switching amplifier 20. However, for ease of explanation in the description to follow, it will be assumed that signal processing unit 16 generates a single-sided PWM signal as switching signal 28.

Switching amplifier 20 is illustrated in FIG. 1 as an inverter which receives switching signal 28 and outputs amplified switching signal 26. (However, as discussed above, switching amplifier 20 may be designed in a variety of different ways.) Switching amplifier 20 switches at a frequency of $F_s$. The amount of amplification depends generally on the magnitude of voltage supply 21. However, the amplification of switching signal 28 also amplifies any switching energy associated with switching signal 28 such that the amplified switching energy within amplified switching signal 26 may cause interference in nearby circuitries, such as, for example, tuner 12. This interference path may be radiated (e.g. electromagnetic radiation) or conducted.

Amplified switching signal 26 may be filtered through a filter such as low pass filter 22 of FIG. 1. Low pass filter 22 helps reduce the switching energy within amplified switching signal 26. The signal from low pass filter 22 is then output to speaker 24. (However, in alternate embodiments, no filtering may be performed on amplified switching signal 26. In these embodiments, low pass filter 22 would not be present and amplified switching signal 26 can be output to speaker 24.)

Figure 2:
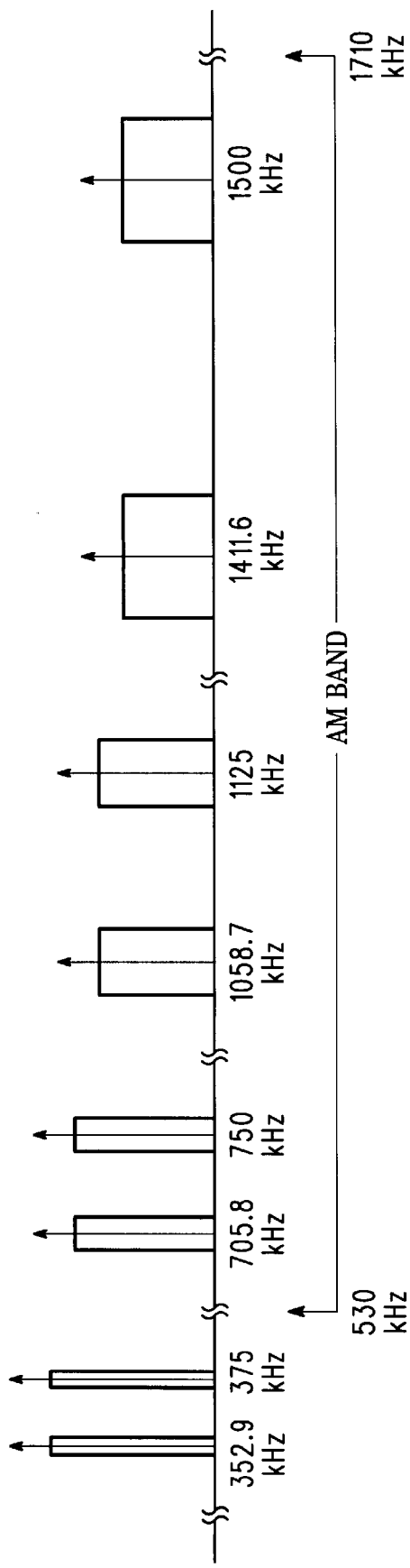
FIG. 2 illustrates a portion of a frequency spectrum of the switching energy of an amplified switching signal in accordance with one embodiment of the present invention.

FIG. 2 illustrates a portion of a frequency spectrum of the switching energy of amplified switching signal 26. The switching energy includes components centered at the switching frequency, $F_s$, as well as at the harmonics of $F_s$. The switching energy also includes sidebands centered about each harmonic of $F_s$. These sidebands are due to intermodulation between $F_s$ and its harmonics and the frequency, $F_m$, of the input audio signal (e.g. demodulated audio signal 30). The switching energy components centered at $F_s$ and the harmonics of $F_s$ can therefore be defined as $(n*F_s \pm m*F_m)$ where n=1, 2, 3 . . . and m=1, 2, 3 . . . . For example, illustrated in FIG. 2 is a switching energy associated with an $F_s$ of 375 kHz. Therefore, a first harmonic of $F_s$ occurs at 375 kHz. The switching energy component centered about 375 kHz is therefore 375±m*$F_m$. As the harmonics of $F_s$ increase, the width of the non-negligible sideband portions (attributed to m*$F_m$) also increase, as can be seen in FIG. 2. The second switching energy component is centered about the second harmonic of $F_s$, 750 kHz, the third centered about 1125 kHz, and the fourth centered about 1500 kHz.

Referring to FIG. 2, the AM band is defined as extending from 530 kHz to 1710 kHz. Therefore, the second, third, and fourth switching energy components (attributable to the harmonics of $F_s$ and the non-negligible sidebands at each harmonic) fall within the AM band. This may therefore result in interference when trying to tune to an AM frequency that falls within these switching energy components. For example, if tuning to a tuning frequency such as 1120 kHz on an AM radio dial coupled to a switching amplifier having a switching frequency of 375 kHz, interference from the switching amplifier may corrupt signal reception. In order to avoid the interference resulting from a tuning frequency falling within a switching energy component, a second switching frequency may be introduced. (Therefore, for illustration purposes, the 375 kHz will be referred to as the first switching frequency.)

As illustrated in FIG. 2, a second switching frequency of 352.9 kHz results in switching energy components centered about its harmonics that are spaced apart from those switching energy components attributable to the first switching frequency of 375 kHz. Therefore, a first harmonic of the second switching frequency occurs at 352.9 kHz. The switching energy component centered about 352.9 kHz is therefore 352.9±m*$F_m$, as was described above. As the harmonics increase, the width of the non-negligible sideband portions (attributed to m*$F_m$) also increase, as can be seen in FIG. 2. The second switching energy component is centered about the second harmonic of the second switching frequency, 705.8 kHz, the third centered about 1058.7 kHz, and the fourth centered about 1411.6 kHz. Note that the switching energy components of each of the two switching frequencies (375 kHz and 352.9 kHz) do not overlap (as can be seen in FIG. 2). Therefore, in order to avoid interference, if a tuning frequency approaches a switching energy component of the first switching frequency (375 kHz), the switching frequency can be shifted to the second switching frequency (352.9 kHz).

Figure 3:
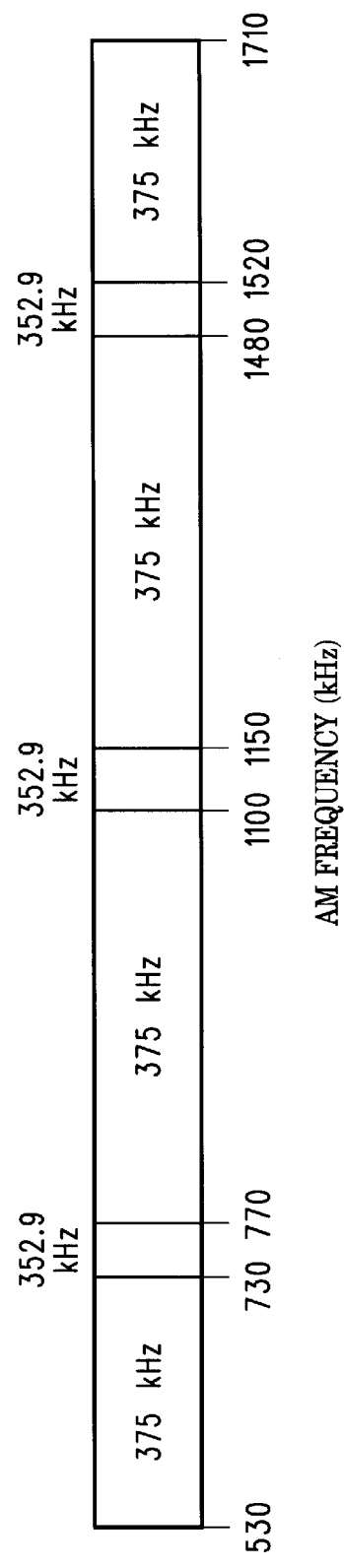
FIG. 3 illustrates an AM frequency band in accordance with one embodiment of the present invention.

FIG. 3 illustrates an AM frequency band in accordance with one embodiment of the present invention. In this embodiment, the first switching frequency, 375 kHz, is generally used within the AM frequency band (530 kHz to 1710 kHz). However, within those bands where interference may occur (generally centered about the harmonics of the first switching frequency), the switching frequency of switching amplifier 20 is shifted to the second switching frequency, 352.9 kHz. For example, the second harmonic of 375 kHz occurs at 750 kHz. Therefore, if the tuning frequency falls within the range of 730 kHz and 770 kHz, the switching frequency of switching amplifier 20 is shifted from 375 kHz to 352.9 kHz. In this manner, the problematic range of 375 kHz±m*$F_m$ is avoided (for the example illustrated in FIGS. 2 and 3). Likewise, if the tuning frequency received from tuner 12 falls within 100 kHz and 1150 kHz or within 1480 kHz and 1520 kHz, the switching frequency of switching amplifier 20 is shifted from 375 kHz to 352.9 kHz.

Note that the ranges in FIG. 3 of 730 kHz to 770 kHz and 1480 kHz to 1520 kHz can be defined by n*$F_s$±20 kHz, where $F_s$ is the first switching frequency of 375 kHz and n corresponds to the harmonic of $F_s$ (where n=2 for the range of 730 kHz to 770 kHz and n=4 for the range of 1480 to 1520). However, note that the range of 1100 kHz to 1150 kHz is n*$F_s$±25 kHz. The ±25 kHz is chosen due to the AM band frequencies being broadcast at intervals of 10 kHz. Therefore, if only ±20 kHz is used, the range would occur between 1105 kHz and 1145 kHz which are not centered about valid AM broadcast frequencies. In alternate embodiments, the AM band frequencies may be broadcast at other intervals such as 5 kHz or 20 kHz, and therefore, different ranges may be defined other than the ±20 kHz or ±25 kHz used in the example of FIG. 3.

While the ranges of 730 kHZ to 770 kHz, 1100 kHz to 1150 kHz, and 1480 kHz to 1520 kHz are illustrated in FIG. 3, one of ordinary skill in the art can appreciate that different ranges may be defined that prevent the tuned frequency from falling within a switching energy component. For example, the ranges may be larger than those shown in FIG. 3. Also, alternate embodiments may define more than just two switching frequencies at which to operate switching amplifier 20. For example, a third switching frequency may be used in addition to the two discussed above. Therefore, other ranges may be defined in which the third switching frequency would be used rather the first or second switching frequencies. More ranges can therefore be defined to indicate when the various switching frequencies are used. Furthermore, alternate embodiments may utilize a feedback method to detect interference and use an algorithm to determine the new switching frequency (as will be described in more detail below).

Additionally, alternate switching frequencies may be used other than the 375 kHz and 352.9 kHz described in the examples above. Generally, the switching frequencies are chosen such that the first harmonics of the switching frequencies fall outside the AM frequency band. Therefore, switching frequencies within the range of 350 kHz to 400 kHz are typically used since the first harmonic of these frequencies fall below 530 kHz. Also, the switching frequencies may be chosen such that the harmonics of the switching frequencies do not fall within the AM or FM intermediate frequencies (IF). For example, the AM IF may be defined at 450 kHz, which is outside the range of 350 kHz to 400 kHz. Also, the FM IF may be defined at 10.7 MHz, meaning a switching frequency within 350 kHz and 400 kHz may be chosen such that its harmonics do not fall within a predetermined band centered about the FM IF (10.7 MHz). Although the typical range is defined as 350 kHz to 400 kHz, a variety of switching frequencies outside this range may be used as well, depending on the needs of the switching amplifier system.

Figure 4:
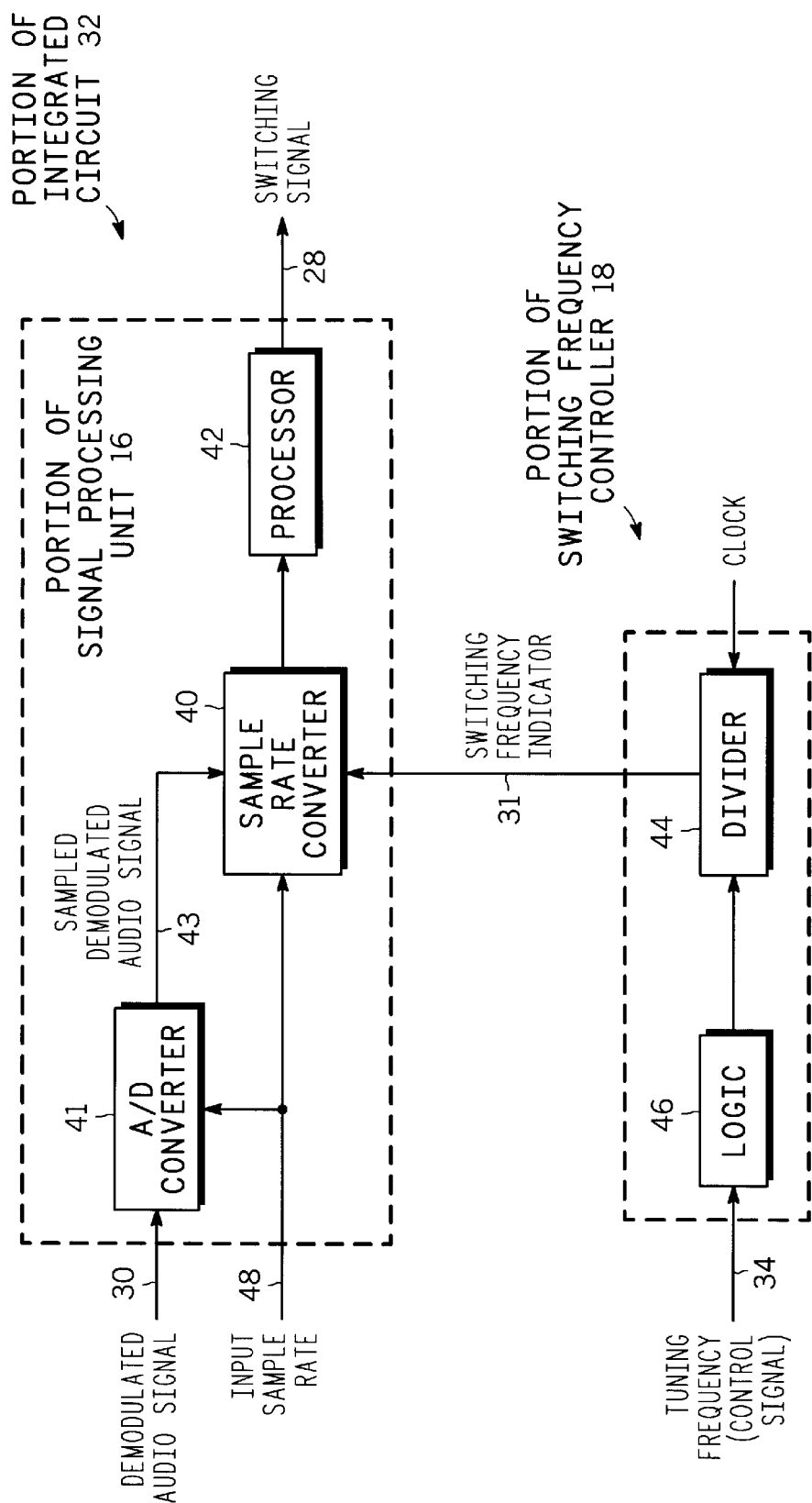
FIG. 4 illustrates, in block diagram form, a portion of an integrated circuit in accordance with one embodiment of the present invention.

FIG. 4 illustrates, in block diagram form, a portion of integrated circuit (IC) 32 of FIG. 1, according to one embodiment of the present invention. FIG. 4 includes a portion of signal processing unit 16 which includes an analog-to-digital (A/D) converter 41 coupled to a sample rate converter 40 coupled to a processor 42. FIG. 4 also includes a portion of switching frequency controller 18 which includes divider 44 coupled to sample rate converter 40, and logic 46 coupled to divider 44. A/D converter 41 receives demodulated audio signal 30 and input sample rate 48 and provides a sampled demodulated audio signal 43 where the sample rate of A/D converter 41 is input sample rate 48. Sample rate converter 40 receives sampled demodulated audio signal 43 and input sample rate 48, and processor 42 outputs switching signal 28. Logic 46 receives control signal 34, and divider 44 receives the CLOCK signal and provides switching frequency indicator 31 to sample rate converter 40.

In operation, A/D converter 41 may not be capable of providing the desired output sample rate which is indicated by switching frequency indicator 31. For example, if the switching frequency, $F_s$, of switching amplifier 20 is 375 kHz, the desired output sample rate at the output of sample rate converter 40 may be 750 kHz (which is a function of $F_s$ where $F_s$ is indicated by switching frequency indicator 31). However, A/D converter 41 may not be capable of providing an output having a sampling frequency of 750 kHz. In this situation, sample rate converter 40 may include an upsampler which receives the sampled demodulated audio signal 43 from A/D converter 41 and modifies its sample rate to achieve the desired 750 kHz and provide this modified signal to processor 42. Note that 375 kHz and 750 kHz are only examples used for illustration purposes; therefore, alternate embodiments may use other switching frequencies. In an alternate embodiment, A/D converter 41 may be capable of outputting sampled demodulated audio signal 43 at the desired output sample rate. In this embodiment, sample rate converter 40 is optional and may be left out of integrated circuit 32. Processor 42 therefore receives the output from sample rate converter 40 (or A/D converter 41 if sample rate converter 40 is not there) and generates switching signal 28, which, in one embodiment, is a PWM signal, as discussed above.

Logic block 46 receives control signal 34, which, in the example illustrated in FIG. 4, is the tuning frequency from tuner 12. Logic 46 determines whether the tuning frequency of tuner 12 falls within a range that requires a switching frequency shift. For example, referring to FIG. 3, logic 46 may determine when the tuning frequency falls within 730 kHz and 770 kHz, or within 1100 kHz and 1150 kHz, or within 1480 kHz and 1520 kHz. If logic 46 detects that a switching frequency shift is required, it provides an indicator to divider 44 which in turn provides switching frequency indicator 31 which indicates to signal processing unit 16 when a switching frequency shift is required. Therefore, in the embodiment illustrated in FIG. 4, divider 44 receives the CLOCK signal from the reference crystal oscillator and divides the CLOCK frequency by a predetermined number which corresponds to the desired switching frequency. For example, if the CLOCK frequency is designed to be 48 MHz and the switching frequency is desired to be 375 kHZ, logic block 46 may indicate a value of N to be 128, such that the CLOCK frequency/N (48 MHz/128) indicates a switching frequency of 375 kHz. Similarly, if the switching frequency is to be shifted to 352.9 kHz, logic block 46 may indicate the value of N to be 136, such that switching frequency indicator 31 indicates 48 MHz/136, which corresponds to 352.9 kHz. Alternate embodiments may use other processing blocks in place of logic block 46 and divider 44 to detect the need for a switching frequency shift and provide the proper indication (e.g. via switching frequency indicator 31) to signal processing unit 16 that results in the desired switching frequency shift.

In an alternate embodiment, demodulated audio signal 30 may be received as a sampled digital signal from a digital broadcaster received by antenna 14. In this embodiment, A/D converter 41 would not be needed since demodulated audio signal 30 would be a sampled demodulated audio signal that could be provided directly to sample rate converter 40. Sample rate converter 40 would therefore receive input sample rate 48 and modify the sample rate of demodulated audio signal 30 to provide the desired switching frequency as indicated by switching frequency indicator 31.

Referring back to FIG. 1, control signal 34 may include a plurality of control signals from tuner 12 to switching frequency controller 18. For example, one of these control signals may indicate that tuner 12 is in a seek or scan mode. In this case, switching frequency controller 18 may indicate, via switching frequency indicator 31, to signal processing unit 16 to stop switching signal 28 from switching during the seek or scan mode. This temporarily prevents switching amplifier 20 from generating the amplified switching energy components discussed above with reference to FIG. 2, thereby preventing tuner 12 from falsely locking on the switching energy components.

In yet another alternate embodiment, FIG. 1 may include a feedback system for detecting interference. As discussed above, switching amplifier system 10 may be a feedforward system that detects when the tuning frequency is in a predetermined range, and in response to this detection, cause the switching frequency to be shifted or modified. However, FIG. 1 may be designed to function in a feedback system where signal processing unit 16 may detect tuner interference based on a feedback signal, such as, for example, amplified switching signal 26, and in response to the detection of interference, provide a control signal (not shown) to switching frequency controller 18 to modify the switching frequency. Therefore, the switching frequencies may be modified in response to the detection of interference rather than in response to the tuner frequency falling within predetermined ranges. Also note that switching frequency controller 18 may modify the switching frequency by selecting between predetermined switching frequencies or by algorithmically modifying the switching frequency based on a previous switching frequency.

Note that the embodiments discussed above in reference to FIG. 1 may apply to both the digital and analog domains. For example, generation of the PWM signal (switching signal 28) can be either in the digital or analog domain. Also note that while FIG. 1 illustrates a single tuner (tuner 12) coupled to a switching amplifier (switching amplifier 20), switching energy components may be introduced by any adjacent switching amplifier. The modification of the switching frequency in response to tuner 12, as discussed above, would therefore apply regardless of the audio source of the switching amplifier. For example, the tuner may drive a low power headphone amplifier within a same system where another driving source such as a CD or DVD player drives a switching amplifier. The switching amplifier driven by the other driving source may be close enough to the tuner to still cause interference. Therefore, the modification of the switching frequency of the switching amplifier, as described above, would help reduce interference of the tuner caused by the switching energy components of the nearby switching amplifier.

In the foregoing specification, the invention has been described with reference to specific embodiments. However, one of ordinary skill in the art appreciates that various modifications and changes can be made without departing from the scope of the present invention as set forth in the claims below. For example, the boxes illustrated in FIGS. 1 and 4 may be separated into more units or be combined into existing units. Furthermore, the blocks illustrated in FIGS. 1 and 4 may be implemented in hardware, software, or in a combination of hardware and software. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A switching amplifier for use in proximity to a tuner that has a control output, comprising:

processor means for receiving a digital input signal and for providing an output signal, responsive to an indicator signal, the output signal for use as a switching output signal, the processor means comprising a sample rate convener for converting the digital input signal to a data rate responsive to the indicator signal; and indicator signal control means for being coupled to the output of the tuner, providing the indicator signal corresponding to a first frequency when the control output indicates a first condition and a second frequency when the control output indicates a second condition.

2. The switching amplifier of claim 1, wherein:

the first condition is a first set of ranges of tuning frequency of the tuner and the second condition is a second set of ranges of tuning frequency of the tuner.

3. The switching amplifier of claim 2 wherein the tuner is an AM radio tuner.

4. The switching amplifier of claim 1, wherein the output signal is pulse width modulated.

5. The switching amplifier of claim 1, wherein the processor means comprises an analog to digital converter for converting an input analog signal to the digital input signal.

6. The switching amplifier of claim 1, wherein the input signal is from a CD player.

7. A method of operating a switching amplifier in proximity to a tuner, comprising:

receiving an input digital signal from the tuner;

responding to a tuner frequency of the tuner by modifying a sample rate of the input digital signal in response to an indicator signal if the switching signal causes interference with the input digital signal;

providing an output signal in response to the input digital signal that is useful for generating a switching signal at a frequency responsive to the indicator signal.

8. The method of claim 7, wherein the step of responding further comprises:

changing the frequency of the switching signal to a predetermined frequency in response to the tuner frequency being within predetermined ranges of frequencies determined to not cause interference at the tuner frequency.

9. The method of claim 7, wherein the step of responding further comprises:

changing the frequency of the switching signal to a predetermined frequency in response to a control signal from the tuner.

10. The method of claim 7, wherein the step of responding further comprises:

changing the frequency of the switching signal to a predetermined frequency in response to detecting that interference to the input signal has occurred.

11. The method of claim 7, wherein the step of responding further comprises:

using the indicator signal to set the frequency of the switching signal to a first frequency when the tuner frequency is within first ranges of frequencies and at a second frequency when the tuner is within second ranges of frequencies.

12. The method of claim 11, wherein the step of responding further comprises:

using the indicator signal to set the frequency of the switching signal to a third frequency when the tuner frequency is within third ranges of frequencies.

13. The method of claim 7, wherein the step of responding further comprises:

calculating a desired frequency of the switching signal based on the tuner frequency; and providing the indicator signal to indicate the desired frequency.

* * * * *

UNITED STATES PATENT AND TRADEMARK OFFICE
CERTIFICATE OF CORRECTION

PATENT NO. : 6,819,912 B2  Page 1 of 1
APPLICATION NO. : 10/008121
DATED : November 5, 2001
INVENTOR(S) : William J Roeckner It is certified that error appears in the above-identified patent and that said Letters Patent is hereby corrected as shown below:

In Column 7, Line 66, Claim No. 1:

Change "rate convener" to --rate converter--

In Column 8, Line 26, Claim No. 7:

Change "switching signal" to --switching amplifier--

Signed and Sealed this

Fourteenth Day of April, 2009

JOHN DOLL
*Acting Director of the United States Patent and Trademark Office*

UNITED STATES PATENT AND TRADEMARK OFFICE
CERTIFICATE OF CORRECTION

PATENT NO.         : 6,819,912 B2                                   Page 1 of 1
APPLICATION NO. : 10/008121
DATED              : November 16, 2004
INVENTOR(S)        : William J Roeckner It is certified that error appears in the above-identified patent and that said Letters Patent is hereby corrected as shown below:

In Column 7, Line 66, Claim No. 1:

Change "rate convener" to --rate converter--

In Column 8, Line 26, Claim No. 7:

Change "switching signal" to --switching amplifier--

This certificate supersedes the Certificate of Correction issued April 14, 2009.

Signed and Sealed this

Twelfth Day of May, 2009

JOHN DOLL
*Acting Director of the United States Patent and Trademark Office*